United States Patent [19]
Bazil et al.

[11] Patent Number: 4,825,097
[45] Date of Patent: Apr. 25, 1989

[54] MASTER-SLAVE D-TYPE FLIP-FLOPS WITH IMPROVED VOLTAGE OFFSET MEANS

[75] Inventors: John C. Bazil; Donald G. Goddard, both of Austin, Tex.

[73] Assignee: Advanced Micro Devices, Inc., Sunnyvale, Calif.

[21] Appl. No.: 146,453

[22] Filed: Jan. 21, 1988

[51] Int. Cl.$^4$ ............................................. H03K 3/289
[52] U.S. Cl. ................................. 307/272.2; 307/491; 307/299.2
[58] Field of Search ...................... 307/272.2, 289.291, 307/299 A, 491

[56] References Cited

U.S. PATENT DOCUMENTS

| 4,289,979 | 9/1981 | Muller | 307/272.2 |
| 4,359,647 | 11/1982 | Trinkl | 307/272.2 |

Primary Examiner—John Zazworsky
Attorney, Agent, or Firm—Davis Chin

[57] ABSTRACT

A master-slave D-type flip-flop includes a master section (14) and a slave section (16). The master section (14) has a master clock differential transistor pair formed of a first input transistor (MQ14) and a first reference transistor (MQ13) whose emitters are connected together. The slave section (16) has a slave clock differential transistor pair formed of a second input transistor (SQ9) and a second reference transistor (SQ10) whose emitters are connected together. An improved voltage offset means is provided for creating a separation of thresholds between the master section and the slave section. The offset voltage means is formed of the first input transistor (MQ14) of the master section having dual-emitters and of the second reference transistor (SQ10) of the slave section having dual-emitters.

8 Claims, 3 Drawing Sheets

FIG. 3(A)

WHERE: $V_{BI} = (1/2) V_{SWING} - 25mV$
$V_{SWING} = V_{OL2} + V_{OH2}$
$V_{SWING} = -900 mV$

FIG. 3(b)

WHERE: $V_{BI} = (1/2) V_{SWING} + 25mV$
$V_{SWING} = V_{OL2} + V_{OH2}$
$V_{SWING} = -900 mV$

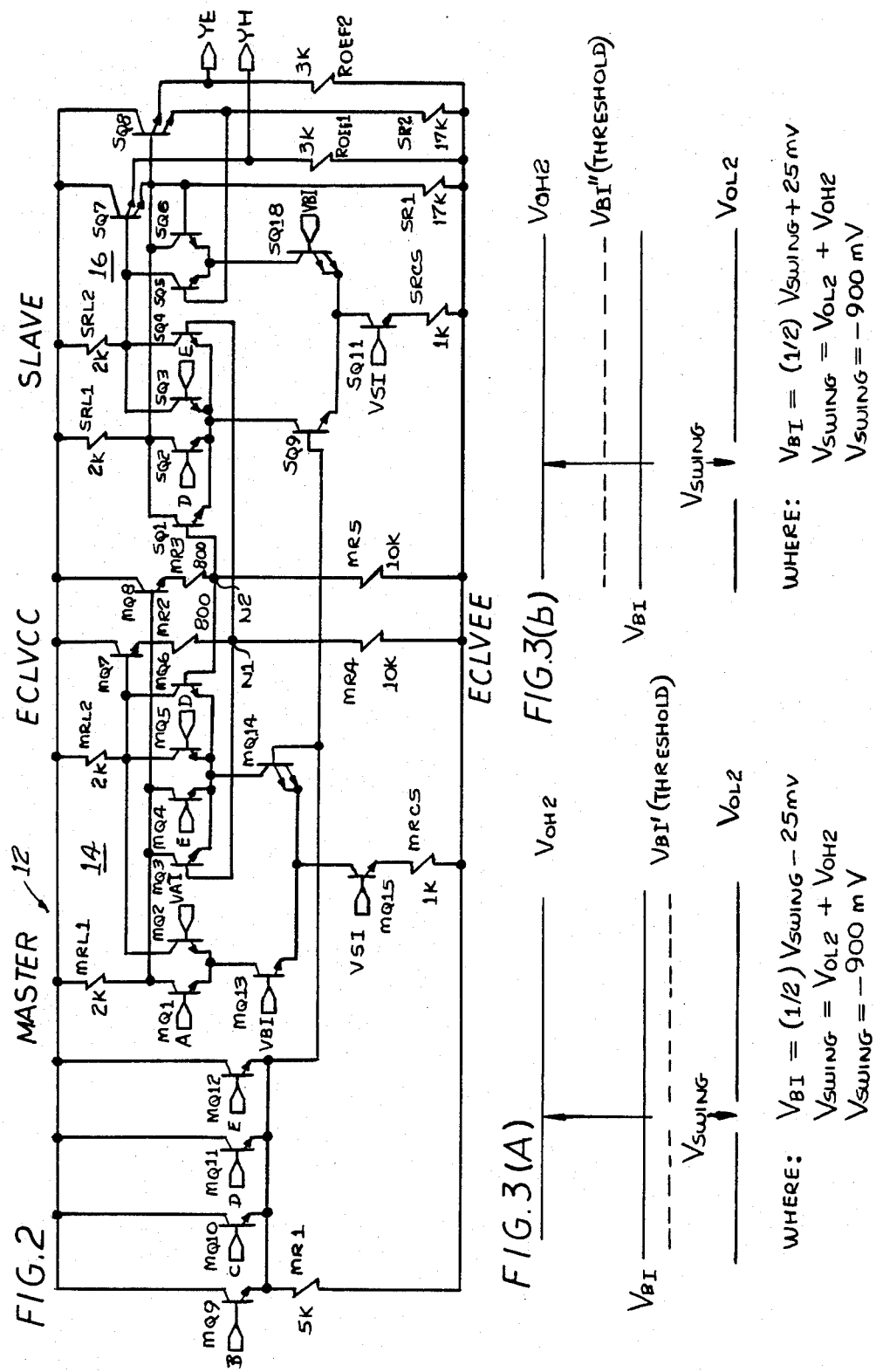

MASTER-SLAVE D-TYPE FLIP-FLOPS WITH IMPROVED VOLTAGE OFFSET MEANS

BACKGROUND OF THE INVENTION

This invention relates generally to logic circuits of the type fabricated on a monolithic silicone semiconductor chip of an integrated circuit and more particularly, it relates to master-slave D-type flip-flop circuits having an improved voltage offset means for creating a separation of thresholds between the master section and the slave section in the flip-flops.

As is well known, one form of flip-flops useful in digital logic applications is a direct coupled master-slave D-type flip-flop which is sometimes referred to as en edge-triggered D-type flip-flop. Such a flip-flop has a single data input (D input), a pair of complementary data outputs (Q and $\overline{Q}$), and a clock input (CLK). Data in the form of a logic level present at the data input (D input) is updated or transferred to the master section when the clock input (CLK) is at the low or "0" logic level. The data is then transferred to the slave section when the clock input CLK makes a transition from the low logic level to a high or "1" logic level. When the clock input CLK changes from the high state back to the low state, the logic state present in the slave section prior to the clock transition is retained or latched at the complementary data outputs (Q and $\overline{Q}$). This latched condition remains regardless of subsequent changes in the data input until such time the clock input CLK means another low-to-high transition.

In order to prevent false information or data from being transferred directly from the master section to the slave section during the clock transition, particularly if the D input is changing at this transition time, there has been provided in the flip-flop of the prior art an offset means for creating a separation of thresholds between the reference voltages in the master and slave sections. Such a typical prior art master-slave D-type flip-flop is illustrated in FIG. 1 of the drawings and has been labeled "Prior Art." This flip-flop 10 is commerically available from Motorola, Inc., of Schaumburg, Ill. under their Part No. designation of MC 1670. The offset voltage between the thresholds of the pair of differentially connected transistors 1Q2/1Q3 in the master section and the pair of differentially connected transistors 2Q2/2Q3 in the slave section of the flip-flop 10 is achieved by an offset resistor R8 and its associated circuit components. While this prior art flip-flop performs adequately the function of preventing the false transferring of data, it suffers from the disadvantage of requiring the use of a resistor R8 which occupies a relatively large amount of chip area. Further, this flip-flop 10 has the disadvantage in that it needs a relatively large number of circuit components in order to implement the offset in the thresholds, thereby increasing the overall power consumption.

It would therefore be advantageous to increase the economy of manufacturing these master-slave D-type flip-flop circuits and to decrease the amount of chip area required. It would also be expedient to provide a flip-flop having a separation of thresholds between the master and slave sections which is formed with a smaller number of circuit components than those that are traditionally available. It would also be expedient to provide such a flip-flop which utilizes a smaller amount of chip area and has a reduced amount of power consumption.

SUMMARY OF THE INVENTION

Accordingly, it is a general object of the present invention to provide a master-slave D-type flip-flop which has an improved voltage offset means for creating a separation of thresholds between the master section and the slave section in the flip-flop.

It is another object of the present invention to provide a master-slave D-type flip-flop which is formed of a smaller chip area than conventionally built flip-flops.

It is another object of the present invention to provide a master-slave D-type flip-flop which is formed with a smaller number of circuit components and has a reduced amount of power consumption than has been traditionally available.

It is still another object of the present invention to provide a master-slave D-type flip-flop which includes an offset voltage means formed of a master clock input transistor having dual emitters and a slave clock reference transistor having dual emitters.

In accordance with these aims and objectives, the present invention is concerned with the provision of a master-slave D-type flip-flop which includes a master section and a slave section. The master section has a master clock differential transistor pair formed of a first input transistor and a first reference transistor whose emitters are connected together. The base of the first input transistor is coupled to receive a clock input signal swinging between a high logic level and a low logic level. The base of the first reference transistor is connected to receive a threshold level voltage set midway between the logic swing of the clock input signal. The first input transistor is formed with dual emitters which serves to effectively lower the threshold level voltage at the base of the first reference transistor to be closer to the low logic level of the clock signal.

The slave section has a slave clock differential transistor pair which is formed of a second input transistor and a second reference transistor whose emitters are connected together. The base of the second input transistor is also coupled to receive the clock input signal. The base of the second reference transistor is also connected to receive the threshold level voltage set midway between the logic swing of the clock input signal. The second reference transistor is formed with dual emitters which serves to effectively raise the threshold level voltage at the base of the second input transistor to be closer to the high logic level of the clock signal. As a result, the threshold level voltages in the master clock differential transistor pair and the slave clock differential transistor pair are offset so as to prevent transferring of false data directly from the master section of the slave section during a low-to-high transition of the clock signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein;

FIG. 2 is a schematic circuit diagram of a master-slave D-type flip-flop of the present invention which includes dual-emitter offset transistors;

FIGS. 3(a) and 3(b) are level diagrams useful for explaining the setting of the threshold voltage levels in the flip-flop constructed in accordacne with the present invention.

DESCRIPTION OF THE PREFERRED EMBODIMENTS

Figure 1:
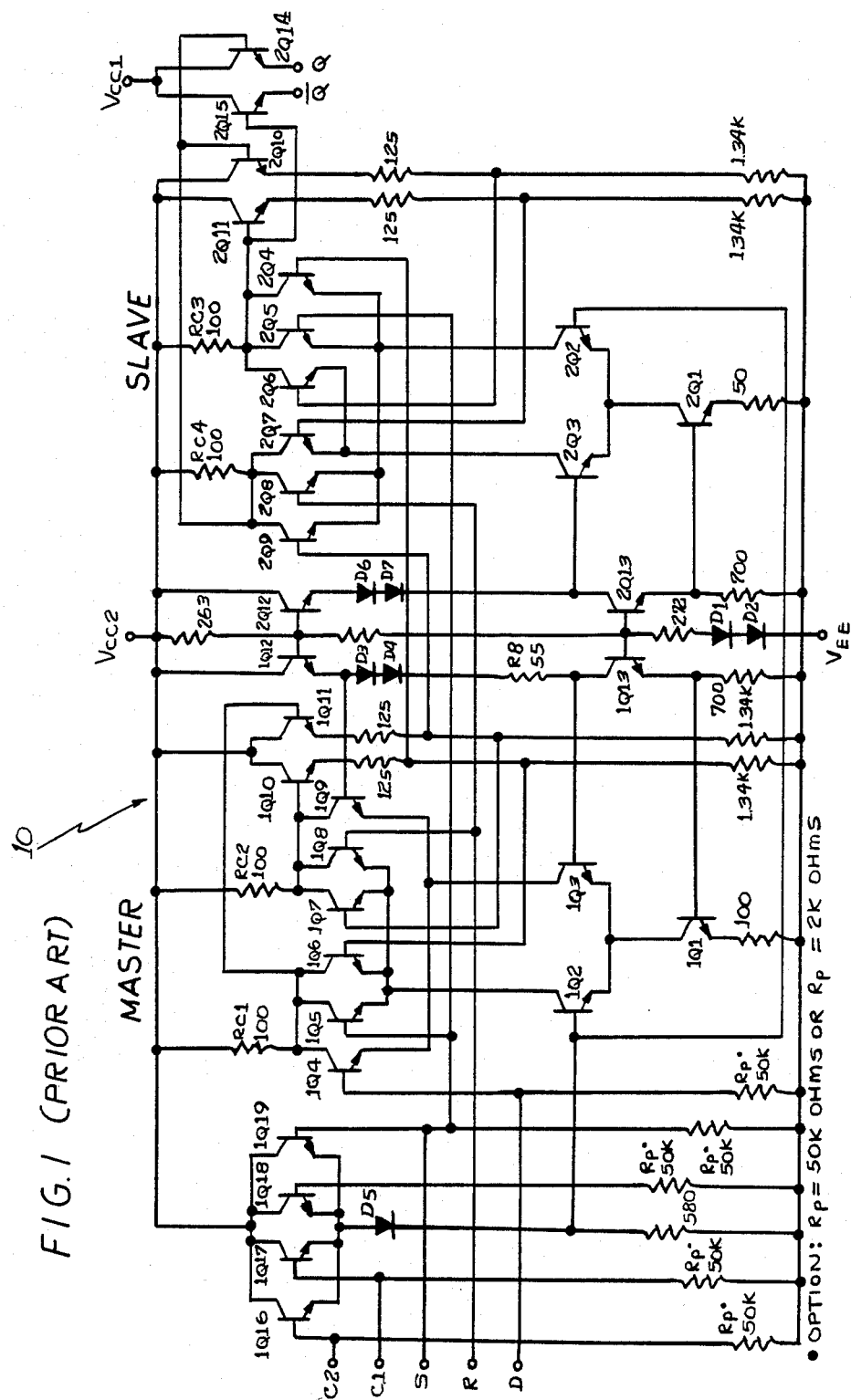
FIG. 1 is a schematic circuit diagram of a prior art master-slave D-type flip-flop.

Referring now in detail to the drawings, there is illustrated in FIG. 2 a schematic circuit diagram of a master-slave D-type flip-flop 12 of the present invention which includes a master section 14 and a slave section 16. The master-slave D-type flip-flop 12 has a data input terminal A for receiving a data input signal, a first clock input terminal B for receiving a first clock input signal, a second clock input terminal C for receiving a second clock input signal, a set input terminal D for receiving a set signal, and a reset input terminal E for receiving a first data output terminal YE for generating a true data output signal Q, and a second data output terminal YH for generating a complementary data output signal $\bar{Q}$.

The master section 14 is formed of a first pair of differentially connected transistors MQ1 and MQ2 having their emitters connected together, a second pair of differentially connected transistors MQ3 and MQ5 having their emitters coupled together, a master clock differential transistor pair MQ13 and MQ14, and a first current source transistor MQ15. The transistor MQ1 of the first pair has its collector connected to a first power source VCC via a first load resistor MRL1 and its base connected to the data input terminal A. The transistor MQ2 of the first pair has its collector connected also to the first power source VCC via a second load resistor MRL2 and its base connected to an internally-generated reference voltage VAI. The common emitters of the transistors MQ1 and MQ2 are tied to the collector of the transistor MQ13 in the master clock differential pair. The transistor MQ13 has its base connected to an internally-generated threshold voltage VBI and its emitter connected to the collector of the first current source transistor MQ15. The transistor MQ15 has its base connected to an internally-generated current source reference voltage VSI and its emitter connected to a second power source VEE via an emitter resistor MRCS. The transistor MQ13 functions as a first reference transistor.

The transistor MQ3 has its collector connected to one end of the first load resistor MRL1, and the transistor MQ6 has its collector connected to the collector of the transistor MQ2. The common emitters of the transistors MQ3 and MQ6 are connected to the collector of the transistor MQ14 in the master clock differential transistor pair. The transistor MQ14 defines a first input transistor and functions as a first offset transistor means for effectively lowering the threshold voltage VBI at the base of the first reference transistor MQ13 as will be discussed more fully hereinafter. This is achieved by forming the transistor MQ14 with dual emitters which causes the voltage drop $V_{BE}$ across the base-emitter junction to be smaller than a single emitter transistor. While the dual emitter transistor MQ14 provides the same amount of the total emitter current $I_E$, the current is split equally between the two emitters. Thus, the current flowing through each emitter will be smaller, thereby creating also a smaller voltage drop $V_{BE}$. As can be seen the dual emitters of the transistor MQ14 are both tied to the single emitter of the transistor MQ13 and to the collector of the transistor MQ15.

A first master emitter follower transistor MQ7 has its collector connected to the first power supply VCC, its base connected to the collectors of the transistor MQ2 and MQ6, and its emitter connected to one end of an emitter load resistor MR2. The other end of the resistor MR2 is connected to one end of a resistor MR4 at a node N1 defining a first output of the master section 14. The node N1 is also connected to the base of the transistor MQ3 in the second pair. A second master emitter follower transistor MQ8 has it collector connected to the first power supply VCC, its base connected to the collectors of the transistors MQ1 and MQ3, and its emitter connected to one end of an emitter resistor MR3. The other end of the resistor MR3 is connected to one end of a resistor MR5 at a node N2 defining a second output of the master section 14. The node N2 is also joined to the base of the transistor MQ6 in the second pair. The other ends of the resistors MR4 and MR5 are tied to the second power source VEE.

The master section 14 further includes a first clock input transistor MQ9, a second clock input transistor MQ10, a set input transistor MQ11, and a reset input transistor MQ12, all of whose respective collectors are tied to the first power source VCC and respective emitters are tied together. The common emitters of the transistors MQ9–MQ12 are also joined to one end of the resistor MR1 and to the base of the first input transistor MQ14 in the master clock differential pair. The other end of the resistor MR1 is connected to the second power source VEE. The first clock input transistor MQ9 has its base connected to the input terminal B, and the second clock input transistor MQ10 has its base connected to the input terminal C. The base of the set input transistor MQ11 is connected to the input terminal D, and the base of the reset input transistor MQ12 is connected to the input terminal D. A transistor MQ4 has its collector connected to the collector of the transistor MQ3 in the second differential pair, its base connected also to the input terminal E, and its emitter connected to the collector of the first input transistor MQ14 in the master clock differential pair. A transistor MQ5 has its collector connected to the collector of the transistors MQ6, its base connected also to the input terminal D, and its emitter connected to the collector of the first input transistor MQ14.

In order to be compatible with ECL (emitter-coupled logic) levels, the first power supply VCC is typically set at 0 volts and the second power source VEE is typically set at −5.2 volts. The data input, first clock input, second clock input, set input and reset input signals applied to the respective input terminals A, B, C, D and E swing between a low logic level (logic "0") set at −1.55 volts and a high logic level (logic "1") set at −0.65 volts. As is well known in ECL circuit design, the reference voltage VAI is set midway between the low and high logic levels applied to the base of the transistor MQ1 or input terminal A. Thus, the reference voltage VAI is set typically at −1.10 volts. Similarly, the threshold voltage VBI is set midway between the low and high logic levels applied to the base of the input transistor MQ14. As can be seen, the logic swing at the base of the input transistor MQ14 is however shifted down one base-emitter voltage $V_{BE}$ (0.8 volt) drop from the input signals applied to the respective input terminals B, C, D or E. Therefore, the low level logic will be at −2.35 volts (−1.55 −0.8) and the high logic level will be at −1.45 volts (−0.65 −0.8). Accordingly, the threshold voltage VBI is typically set at −1.90 volts. The current source reference voltage VSI is typically set at −3.80 volts so as to provide a constant current.

The slave section 16 is formed of a third pair of differentially connected transistors SQ1 and SQ4 having their emitters connected together, a fourth pair of differentially connected transistors SQ5 and SQ6 having their emitters connected together, a slave clock differential transistor pair SQ9 and SQ10 having their emitters connected together, and a second current source transistor SQ11. The transistor SQ1 has its collector connected to the first power source VCC via a third load resistor SRL1 and its base connected to the other end of the resistor MR3 at the node N2 in the master section 14. The transistor SQ4 has its collector connected to the first power source VCC via a fourth load resistor SRL2 and its base connected to the other end of the resistor MR2 at the node N1 in the master section 14. The common emitters of the transistors SQ1 and SQ4 are connected to the collector of the transistor SQ9 in the slave clock differential transistor pair. The transistor SQ9 has its base connected to the common emitters of the input transistors MQ9–MQ12 and its emitter connected to the collector of the second current source transistor SQ11. The transistor SQ9 defines an input transistor of the slave clock differential transistor pair. The transistor SQ11 has its base connected to the current source reference voltage VSI and its emitter connected to the second power source VEE via an emitter resistor SRCS.

The transistor SQ5 has its collector connected to one end of the fourth load resistor SRL2, and the transistor SQ6 has its collector connected to the collector of the transistor SQ1. The common emitters of the transistors SQ5 and SQ6 are connected to the collector of the transistor SQ10 in the slave clock differential transistor pair. The transistor SQ10 defines a reference transistor which serves as a second offset transistor means for effectively raising the threshold voltage VBI at the base of the input transistor SQ9, as will be discussed more fully hereinafter. This is achieved by forming the reference transistor SQ10 with dual emitters similar to the reference MQ14 in the master section 14 which was previously explained. As will be noted, the dual emitters of the transistor SQ10 are both tied to the single emitter of the transistor SQ9 and to the collector of the current source transistor SQ11.

A first slave emitter follower transistor SQ7 has its collector connected to the first power source VCC, its base connected to the common collectors of the transistors SQ4 and SQ5, and its first emitter connected to one end of an output resistor ROEF1 and to an output terminal YH for generating a complementary date output $\overline{Q}$. The second emitter of the transistor SQ7 is connected to one end of a resistor SR1 and to the base of the transistor SQ6 in the fourth differential pair. A second slave emitter follower transistor SQ8 has its collector connected to the first power source VCC and its base connected to the common collectors of the transistors SQ1 and SQ6. The first emitter of the transistor SQ8 is connected to one end of an output resistor ROEF2 and to an output terminal YE for generating a true data output Q. The second emitter of the transistor SQ8 is connected to one end of a resistor SR2 and to the base of the transistor SQ5 in the fourth differential pair. The other ends of the resistors SR1, SR2, ROEF1 and ROEF2 are all tied together and to the second power source VEE.

The slave section 16 further includes a transistor SQ2 which has its collector connected to the collector of the transistor SQ1 in the third differential pair, its base connected also to the input terminal D, and its emitter connected to the collector of the input transistor SQ9 in the slave clock differential transistor pair. A transistor SQ3 has its collector connected to the collector of the transistor SQ4, its base connected to the input terminal E, and its emitter connected to the collector of the transistor SQ9. As can be seen, the logic swing at the base of the input transistor SQ9 is also shifted down one $V_{BE}$ drop from the input signals applied to input terminals B, C, D or E. Therefore, the logic swing at the base of the transistor SQ9 is between the low logic level of −2.35 volts and the high logic level of −1.45 volts. Consequently, the threshold voltage VBI at the base of the reference transistor SQ10 is also typically set at −1.90 volts. Again, the current source reference voltage VSI is set at −3.80 volts so as to provide the constant current.

The operation of the master slave D-type flip-flop circuit shown in FIG. 2 will now be described. It will be assumed initially that the data input signal on terminal A, the first clock signal on terminal B, the second clock signal on terminal C, the set signal on terminal D and the reset signal on terminal E are all at a low logic level (−1.55 volts). Further, it will be assumed that the true output terminal YE is also at the low logic level (−1.55 volts) and that the complementary output terminal YH is at the high logic level (−0.65 volts). Thus, the true and complementary output terminals are also compatible with ECL circuitry. Since the transistors MQ1 and MQ9 through MQ12 are rendered non-conductive under this condition, the transistors MQ13 and SQ10 will be conducting. In the slave section 16, the transistors SQ5 and SQ6 defining latch transistors are in series with the reference transistor SQ10. The true output data Q at the second emitter of the emitter follower transistor SQ8 is fed back to the base of the latch transistor SQ5. The complementary output data $\overline{Q}$ at the second emitter of the emitter follower transistor SQ7 is fed back to the base of the latch transistor SQ6. Thus, the transistor SQ6 is rendered conductive. Accordingly, when the clock signals are at the low logic level, the output states of the slave section 16 are maintained or latched. In the master section 14, the current path is through the transistor MQ13 and the transistor MQ2.

Now, assume that the data input signal at the terminal A is switched to a high logic level (−0.65 volts). This data input signal being at the high logic level is applied to the base of the transistor MQ1 which will cause it to be conductive and will render the transistor MQ2 to be non-conductive. With the transistor MQ1 being conductive, a voltage drop will be developed across the load resistor MRL1 which causes a low logic level to appear on the base of the emitter follower transistor MQ8 and thus also on its emitter. Since the transistor MS2 is turned-off, there is essentially no current flow through the load resistor MRL2 and therefore the base of the emitter follower transistor MQ7 will be at a high logic level. This is reflected in the emitter of the transistor MQ7 and is in turn transferred to the base of the transistor MQ3. While the transistor MQ3 is now biased for conduction, there will still be no current flow since there is no current path.

Next, it will be assumed that one of the clock input signals at the terminals B or C is switched to a high logic level (−0.65 volts). As the leading edge of the clock signal rises, the dual-emitter transistor MQ14 will be rendered conductive and the transistor MQ13 will be rendered non-conductive. Thus, a current path will now be created through the transistor MQ3, transistor MQ14, and the load resistor MRL1 since the base of the transistor MQ3 is the only one of the transistors MQ3–MQ6 that is in a high state. As a result, the base and emitter junctions of the emitter follower transistor MQ8 is maintained in the low logic level, and the base and emitter junctions of the emitter follower transistor MQ7 is maintained in the high logic level. The high logic level at the emitter follower transistor MQ7 is transferred to the base of the transistor SQ4 in the slave section 16 via the node N1.

While the transistor SQ4 is now biased for conduction, there will again be no current flow since there is not current path. As the leading edge of the clock signal continues to rise, the input transistor SQ9 will be rendered conductive and the dual-emitter transistor SQ10 will be rendered non-conductive. It will be noted that the threshold voltages VBI in the master section (base of transistor MQ13) and in the slave section (base of transistor SQ10) are slightly offset so as to insure prior clocking of the master section as will be explained more fully hereinbelow. With the transistor SQ9 in the conductive state and the base of the transistor SQ4 at the high logic level, a current path will be created through the transistor SQ9, the transistor SQ4 and teh load resistor SRL2. Since a voltage drop will be developed across the load resistor SRL2, this causes a low logic level to appear on the base of the emitter follower transistor SQ7 and thus also to its emitter. Since all of the transistors SQ1–SQ3 are turned off, there is essentially no current flow through the load resistor SRL1 and therefore the base of the emitter follower transistor SQ8 will be at a high logic level. This is reflected in the first emitter of the transistor SQ8 which is also the true output terminal YE. The second emitter (Q) of the transistor SQ8 is also at a high logic level and is fed back to the base of the latch transistor SQ5. Similarly, the low logic level at the first emitter of the transistor SQ7 will be passed to the complementary output terminal YH. The second emitter (Q̄) of the transistor SQ7 will also be at a low logic level and is fed back to the base of the latch transistor SQ6.

As the training edge of the clock signal falls, the input transistor SQ9 will be rendered non-conductive and the transistor SQ10 will be rendered conductive. Accordingly, a current path will then be created through one of the latch transistors, thereby "locking in" or latching the slave outputs at the output terminals YE and YH. In this instance, the latch transistor SQ6 will be non-conductive so as to maintain the base and emitter of the emitter follower transistor SQ8 and the output terminal YE in the high logic level. Further, this high logic level is fed to the base of the latch transistor SQ5 so as to maintain the base and emitter of the transistor SQ7 and the output terminal YH in the low logic level.

In the master section, the falling edge of the clock signal will cause the transistor MQ14 to be non-conductive and the transistor MQ13 to be conductive. As a result, this enables the transistor MQ1 so that the output nodes N1 and N2 of the master section 14 will again follow or track the data input signal applied to the input terminal D.

The set input signal at the bases of the transistors MQ11, MQ5 and SQ2 is normally at a low logic level. When it is desired to set the output terminal YE to a high logic level without the use of a clock input signal, a high logic level is applied to the bases of the transistors MQ11, MQ5 and SQ2. Similarly, the reset input signal at the bases of the transistors MQ12, MQ4 and MQ3 is normally at a low logic level. When it is desired to reset the output terminal YE to a low logic level without the use of a clock signal, a high logic level is applied to the bases of the transistors MQ12, MQ4 and MQ3. Therefore, this flop-flop circuit is referred to as having an asynchronous set and reset function.

FIGS. 3(a) and 3(b) are level diagrams useful in explaining the voltage offset between the thresholds of the master clock differential transistor pair (MQ13 and MQ14) in the master section 14 and the slave clock differential transistor pair (SQ9 and SQ10) in the slave section 16. As will be recalled, the common emitters of the transistors MQ9–MQ12 has a swing between a high logic level $V_{OH2}$ ($-1.45$ volts) and a low logic level $V_{OL2}$ ($-2.35$ volts). Thus, the typical threshold voltage level VBI at the base of the transistor MQ13 in the master section 14 should be midway between the high and low logic swing or $-1.90$ volts, which is shown as a solid line designated VBI in FIG. 3(a). However, since there is a smaller $V_{BE}$ drop in the dual emitter transistor MQ14, this has the effect of lowering the threshold voltage level VBI by approximately 25 mV to a dotted line designated VBI'. This means that the rising edge of the clock input signal will reach the new threshold voltage level VBI' in the master section 14 earlier than if no shifting had occurred. This shaft downwardly to a lower threshold level VBI' closer to the low logic level causes the disabling of the data input terminal D in the master section prior to enabling of the information transfer from the master section to the slave section via the transistors SQ1 and SQ4.

Referring now to FIG. 3(b), a solid line designated VBI is the typical threshold voltage level at the base of the trainsistor SQ10 in the slave section 16. Again, this threshold level VBI is midway between the high logic level $V_{OH2}$ and the low logic level $V_{OL2}$. However, since there is a smaller $V_{BE}$ drop in the dual-emitter transistor SQ10, this has the effect of raising the threshold level VBI by approximately 25 mV to a dotted line designated VBI". Since this threshold level VBI" is moved upwardly and closer towards the high logic level $V_{OH2}$, this means that the rising edge of the clock input signal will reach the new threshold level VBI" in the slave section 16 later than if no shifting had occurred. This shift upwardly to a higher threshold level VBI" causes a delay in the enabling of the slave section 16.

The overall effect of the downward and upward shifts prevents false information from being transferred directly from the master section 14 to the slave section 16 during a low-to-high clock transition. This is particularly likely to occur if the data input signal at the terminal A changes at the same time when the clock transition takes place. This voltage offset between the thresholds of the clock differential pairs in the master and slave sections. allows a relatively slow-rising clock waveform to be used without the danger of losing information during the clock transition. Another case of false latching can occur on a slow-falling clock waveform in a high-to-low transition if the data has changed while the clock is in the high state.

Since this voltage offset is implemented in the present invention by the use of dual-emitter transistors MQ14 and SQ10 rather than an offset resistor, the present flip-flop occupies a relatively smaller amount of chip area. Further, the instant flip-flop requires a fewer number of circuit components and thus has a reduced amount of power consumption.

Figure 4:
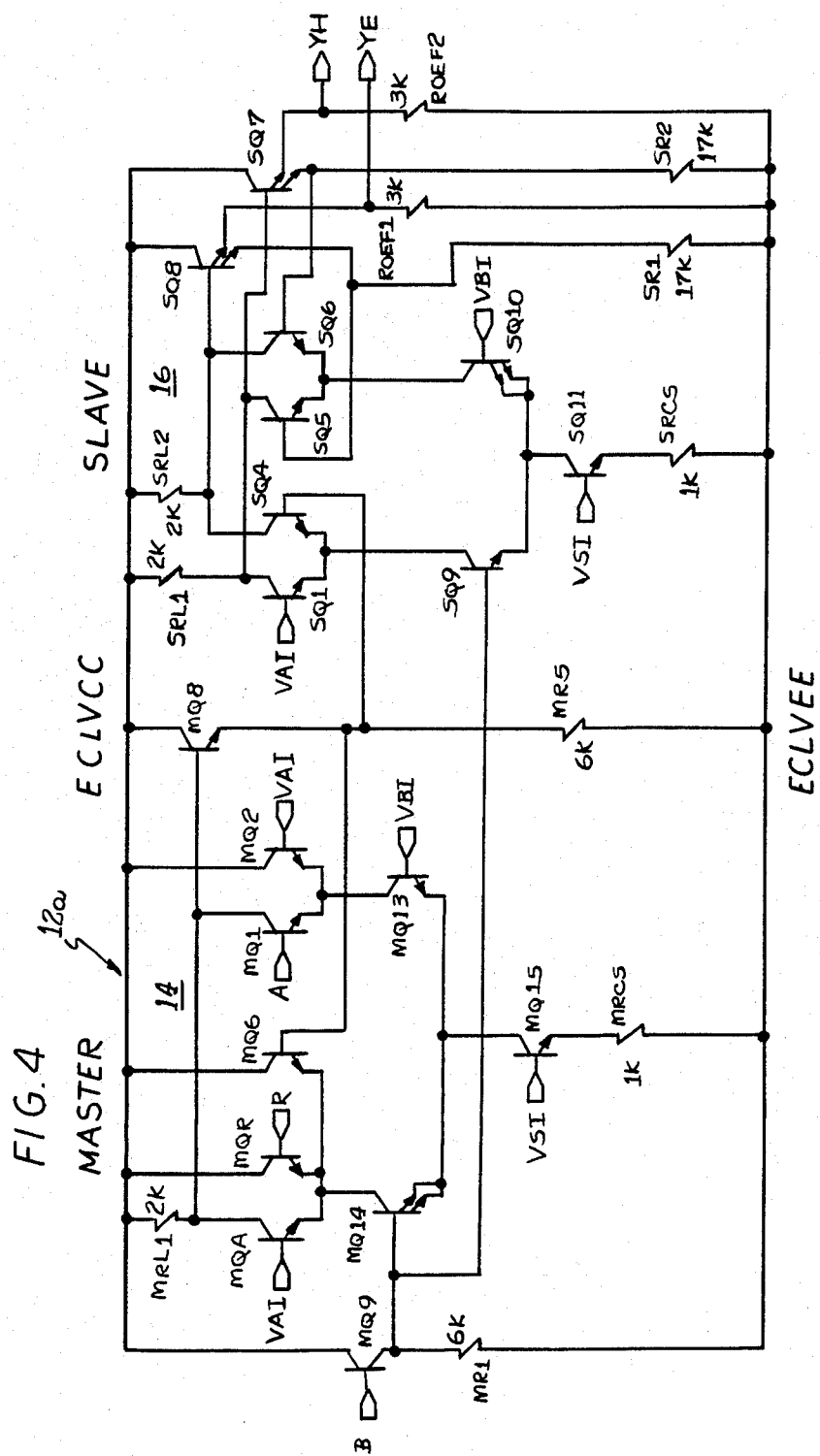
FIG. 4 is a schematic circuit diagram of a second embodiment of a master-slave D-type flip-flop of the present invention.

Referring now to FIG. 4, there is shown a schematic circuit diagram of a second embodiment of a master-slave D-type flip-flop 12a. Since the flip-flop 12a is quite similar to the flip-flop 12 of FIG. 2, only the differences will now be discussed in detail. In the flip-flop 12a, there has been eliminated the second clock input transistor MQ10; set transistor MQ11, MQ5 and SQ2; reset transistors MQ12, MQ4 and SQ3; load resistor MRL2; emitter follower transistor MQ7; and emitter resistor MR4. As can be seen, this flip-flop 12a is much simpler and uses a fewer number of components than the flip-flop 12 since the transistors required for performing the asynchronous set and reset function have been eliminated as well as one clock input transistor. Further, the flip-flop 12a uses only one emitter follower transistor MQ8 in the master section 14 whose emitter output is fed back to the latch transistor MQ6 in the master section 14 and is fed forward to the transistor SQ4 in the slave section 16. In addition, a reset transistor MQR has been added which receives a pulse input signal on input terminal R so as to provide a synchronous reset function. Normally, the input signal on the terminal R is at a low logic level. When a high logic level is applied to the input terminal R, the output terminal YE is forced to a low logic level if the clock in the input terminal B is high. The dual-emitter transistor MQ14 and SQ10 again provides a voltage offset between the threshold levels in the master and slave sections, which is the same as that shown in FIGS. 3(a) and 3(b). Except for these differences point out, the flip-flop 12a functions in the same manner as the flip-flop 12 previously described and thus will not be repeated.

From the foregoing detailed description, it can thus be seen that the present invention provides master-slave D-type flip-flops having improved voltage offset means for creating a separation of thresholds between the master section and the slave sections in the flip-flops. The voltage offset is achieved in the present invention by the use of dual-emitter transistors in the master clock differential transistor pair and in the slave clock differential transistor pair. As a result, the flip-flop can be fabricated with the use of a smaller amount of chip area.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:
1. A master-slave D-type flip-flop comprising:
   a master section (14) having a master clock differential transistor pair formed of a first input transistor (MQ14) and a first reference transistor (MQ13) whose emitters are connected together;
   the base of said input transistor (MQ14) being coupled to receive a clock input signal swinging between a high logic level and a low logic level;
   the base of said reference transistor (MQ13) being connected to receive a threshold voltage level (VBI) set midway between the logic swing of said clock input signal;
   means for effectively lowering of said threshold voltage level (VBI) at the base of said first input transistor to be closer to said low logic level of said clock signal, said means for effectively lowering of said threshold voltage level being formed of said first input transistor (MQ14) having dual-emitters;
   a slave section (16) having a slave clock differential transistor pair formed of a second input transistor (SQ9) and a second reference transistor (SQ10) whose emitters are connected together;
   the base of said second input transistor (SQ9) being also coupled to receive said clock input signal;
   the base of said second reference transistor (SQ10) being connected also to receive said threshold voltage level (VBI) set midway between the logic swing of said clock input signal;
   means for effectively raising of said threshold voltage level (VBI) at the base of said second input transistor (SQ9) to be closer to said high logic level of said clock signal, said means for effectively raising of said threshold voltage level being formed of said second reference transistor (SQ10) having dual-emitters;
   said slave section (16) including a pair of differentially connected transistor pair formed of a first latch transistor (SQ5) and a second latch transistor (SQ6) whose emitters are connected together and to the collector of said second reference transistor (SQ10);
   a first slave emitter follower transistor (SQ7) having its base connected to the collector of said first latch transistor (SQ5) and dual-emitters, one of the dual-emitters being connected to a first output terminal for generating a complementary data output signal compatible with ECL circuits, the other one of the dual-emitters being connected to the base of said second latch transistor (SQ6); and
   a second slave emitter follower transistor (SQ8) having its base connected to the collector of said second latch transistor (SQ6) and dual-emitters, one of the dual-emitters being connected to a second output terminal for generating a true data output signal compatible with ECL circuits, the other one of the dual-emitters being connected to the base of said first latch transistor (SQ5),
   whereby the threshold voltage levels in said master clock differential transistor pair in said master section and in said slave clock differential transistor pair in said slave section are offset so as to prevent transferring of false data directly from the master section to the slave section during low-to-high and high-to-low transistions of said clock signal.

2. A flip-flop as claimed in claim 1, wherein said high logic level of said clock signal is approximately $-0.65$ volts and said low logic level of said clock signal is approximately $-1.55$ volts so as to be compatible with ECL circuits.

3. A flip-flop as claimed in claim 2, wherein said high logic level of said clock signal at the base of said first input transistor (MS14) is shifted downwardly to approximately $-1.45$ volts and said low logic level of said clock signal at the base of said first input transistor (MS14) is shifted down to approximately −2.35 volts.

4. A flip-flop as claimed in claim 3, wherein said threshold voltage level at base of said first reference transistor (MQ13) is set at approximately −1.90 volts.

5. A flip-flop as claimed in claim 4, wherein the effective threshold voltage level at the base of said first input transistor (MQ14) is approximately 25 mV lower than said threshold voltage level of −1.90 volts.

6. A flip-flop as claimed in claim 5, wherein said high logic level of said clock signal at the base of said second input transistor (SQ9) is shifted downwardly to approximately −1.45 volts and said low logic level of said clock signal at the base of said second input transistor (SQ9) is shifted down to approximately −2.35 volts.

7. A flip-flop as claimed in claim 6, wherein said threshold voltage level at the base of said second reference transistor (SQ10) is set at approximately −1.90 volts.

8. A flip-flop as claimed in claim 7, wherein the effective threshold voltage level at the base of said second input transistor (SQ9) is approximately 25 mV higher than said threshold voltage level of −1.90 volts.

* * * * *